United States Patent
Suzuki et al.

(10) Patent No.: US 8,625,327 B2
(45) Date of Patent: *Jan. 7, 2014

(54) MAGNETIC RANDOM ACCESS MEMORY AND INITIALIZING METHOD FOR THE SAME

(75) Inventors: Tetsuhiro Suzuki, Tokyo (JP);
Shunsuke Fukami, Tokyo (JP);
Kiyokazu Nagahara, Tokyo (JP);
Norikazu Oshima, Tokyo (JP);
Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 240 days.

This patent is subject to a terminal disclaimer.

(21) Appl. No.: 13/054,577

(22) PCT Filed: Jul. 2, 2009

(86) PCT No.: PCT/JP2009/062083
§ 371 (c)(1),
(2), (4) Date: Jan. 18, 2011

(87) PCT Pub. No.: WO2010/007893
PCT Pub. Date: Jan. 21, 2010

(65) Prior Publication Data
US 2011/0116306 A1    May 19, 2011

(30) Foreign Application Priority Data
Jul. 15, 2008 (JP) .................... 2008-183703

(51) Int. Cl.
*G11C 11/00* (2006.01)

(52) U.S. Cl.
USPC ........... 365/148; 365/145; 365/158; 365/163; 365/171; 365/173; 257/414; 257/421

(58) Field of Classification Search
USPC ................ 365/148, 158, 171, 173, 145, 163; 257/414, 421
See application file for complete search history.

(56) References Cited

U.S. PATENT DOCUMENTS

| 6,834,005 B1 | 12/2004 | Parkin |
| 2006/0238191 A1* | 10/2006 | Saito ............................ 324/252 |
| 2007/0217256 A1* | 9/2007 | Ono ............................. 365/171 |
| 2009/0109739 A1* | 4/2009 | Ranjan et al. ................. 365/171 |

FOREIGN PATENT DOCUMENTS

| JP | 03-238688 | 10/1991 |
| JP | 2003-078185 | 3/2003 |
| JP | 2005-093488 | 4/2005 |

(Continued)

OTHER PUBLICATIONS

International Search Report—PCT/JP2009/062083—Aug. 11, 2009.

(Continued)

*Primary Examiner* — Thao Bui
(74) *Attorney, Agent, or Firm* — Young & Thompson

(57) ABSTRACT

A domain wall motion type MRAM has: a magnetic recording layer 10 being a ferromagnetic layer having perpendicular magnetic anisotropy; a pair of current supply terminals 14a and 14b connected to the magnetic recording layer 10 for supplying a current to the magnetic recording layer 10; and an anti-ferromagnetic layer 45 being in contact with a first region R1 of the magnetic recording layer 10. The first region R1 includes a part of a current supply region RA of the magnetic recording layer 10 that is between the pair of current supply terminals 14a and 14b.

8 Claims, 13 Drawing Sheets

(56) References Cited

FOREIGN PATENT DOCUMENTS

| | | |
|---|---|---|
| JP | 2005-191032 | 7/2005 |
| JP | 2006-073930 | 3/2006 |
| JP | 2006-303159 | 11/2006 |
| JP | 2007-103663 | 4/2007 |
| JP | 2007-201059 | 8/2007 |
| JP | 2008-034808 | 2/2008 |
| WO | 2005/069368 | 7/2005 |
| WO | 2008/068967 | 6/2008 |

OTHER PUBLICATIONS

Japanese Official Action—2010-520823—Aug. 15, 2013.

* cited by examiner

MAGNETIC RANDOM ACCESS MEMORY AND INITIALIZING METHOD FOR THE SAME

CROSS-REFERENCE TO RELATED APPLICATIONS

This application is based upon and claims the benefit of priority from the prior Japanese Patent Application No. 2008-183703, filed Jul. 15 2008, the entire contents of which are incorporated herein by reference.

TECHNICAL FIELD

The present invention relates to a magnetic random access memory (MRAM: Magnetic Random Access Memory). In particular, the present invention relates to a domain wall motion type MRAM.

BACKGROUND ART

An MRAM is a promising nonvolatile memory from a viewpoint of high integration and high-speed operation. In the MRAM, a magnetoresistance element that exhibits a "magnetoresistance effect" such as TMR (Tunnel MagnetoResistance) effect is utilized. In the magnetoresistance element, for example, a magnetic tunnel junction (MTJ: Magnetic Tunnel Junction) in which a tunnel barrier layer is sandwiched by two ferromagnetic layers is formed. The two ferromagnetic layers include a magnetization fixed layer (pinned layer) whose magnetization direction is fixed and a magnetization free layer (free layer) whose magnetization direction is reversible.

It is known that a resistance value $(R+\Delta R)$ of the MTJ when the magnetization directions of the pinned layer and the free layer are "anti-parallel" to each other becomes larger than a resistance value (R) when the magnetization directions are "parallel" to each other due to the magnetoresistance effect. The MRAM uses the magnetoresistance element having the MTJ as a memory cell and nonvolatilely stores data by utilizing the change in the resistance value. For example, the anti-parallel state is related to data "1" and the parallel state is related to data "0". Data writing to the memory cell is performed by switching the magnetization direction of the free layer.

Conventionally known methods of data writing to the MRAM include an "asteroid method" and a "toggle method". According to these write methods, a magnetic switching field necessary for switching the magnetization direction of the free layer increases in substantially inverse proportion to a size of the memory cell. That is to say, a write current tends to increase with the miniaturization of the memory cell.

As a write method capable of suppressing the increase in the write current with the miniaturization, there is proposed a "spin transfer method" (for example, refer to Japanese Patent Publication JP-2005-93488 (PTL1)). According to the spin transfer method, a spin-polarized current is injected to a ferromagnetic conductor, and direct interaction between spin of conduction electrons of the current and magnetic moment of the conductor causes the magnetization to be switched (hereinafter referred to as "Spin Transfer Magnetization Switching").

U.S. Pat. No. 6,834,005 (PTL2) discloses a magnetic shift resister that utilizes the spin transfer. The magnetic shift resister stores data by utilizing a domain wall in a magnetic body. In the magnetic body having a large number of separated regions (magnetic domains) caused by forming constricted sections, a current is so supplied as to pass through the domain wall and the current causes the domain wall to move. The magnetization direction in each of the regions is treated as a record data. For example, such a magnetic shift resister is used for recording large quantities of serial data.

A "domain wall motion type MRAM" that utilizes the domain wall motion based on the spin transfer is described in Japanese Patent Publication JP-2005-191032 (PTL3), International Publication WO2005/069368 (PTL4), Japanese Patent Publication JP-2006-73930 (PTL5), Japanese Patent Publication JP-2006-303159 (PTL6) and so on. The domain wall motion type MRAM is typically provided with a "magnetic recording layer" in which the domain wall moves, instead of the free layer. More specifically, the magnetic recording layer has a magnetization switching region corresponding to the free layer whose magnetization direction is reversible and a magnetization fixed region whose magnetization direction does not substantially change. The pinned layer is connected to the magnetization switching region through a tunnel barrier layer. At a time of data writing, a write current flows in an in-plane direction in the magnetic recording layer, and the magnetization direction of the magnetization switching region is changed due to the domain wall motion.

FIG. 1 shows a structure of a magnetic recording layer 100 described in Japanese Patent Publication JP-2005-191032 (PTL3). The magnetic recording layer 100 has a linear shape. More specifically, the magnetic recording layer 100 has a connector section 103 overlapping with a tunnel insulating layer and a pinned layer, constricted sections 104 adjacent to both ends of the connector section 103, and a pair of magnetization fixed sections 101 and 102 respectively formed adjacent to the constricted sections 104. The magnetization fixed sections 101 and 102 are respectively provided with fixed magnetizations whose directions are opposite to each other. Furthermore, write terminals 105 and 106 are electrically connected to the magnetization fixed sections 101 and 102, respectively. By using the write terminals 105 and 106, a write current penetrating through the connector section 103, the pair of constricted sections 104 and the pair of magnetization fixed sections 101 and 102 can be supplied, and thus the domain wall motion in the connector section 103 is controlled. The constricted sections 104 on the both sides of the connector section 103 function as pinning potentials for the domain wall, namely trapping sites for trapping the domain wall.

FIG. 2 shows a structure of a magnetic recording layer 110 described in International Publication WO2005/069368 (PTL4). The magnetic recording layer 110 consists of three sections having different thicknesses. More specifically, the magnetic recording layer 110 consists of a first magnetization fixed section 111 that is the thickest, a second magnetization fixed section 112 that is the next thickest, and a connector section 113 that is the thinnest and disposed between them. The first magnetization fixed section 111 and the second magnetization fixed section 112 are respectively provided with fixed magnetizations whose directions are opposite to each other. The reason why the first magnetization fixed section 111 and the second magnetization fixed section 112 are different in the thickness is to utilize, at a time of initialization, difference in coercivity to magnetize the respective with the fixed magnetizations whose directions are opposite to each other. In the case of the structure shown in FIG. 2, two differences in level (one is at a boundary between the connector section 113 and the first magnetization fixed section 111, and the other is at a boundary between the connector section 113 and the second magnetization fixed section 112)

function as pinning potentials for a domain wall 114, namely trapping sites for trapping the domain wall 114. For example, the domain wall 114 is trapped at the boundary between the connector section 113 and the magnetization fixed section 111.

In should be noted that, in the structure shown in FIG. 2, a magnetic body having perpendicular magnetic anisotropy (magnetic anisotropy perpendicular to a film surface) is used as the magnetic recording layer 110. To use the magnetic body having the perpendicular magnetic anisotropy is preferable in terms of reduction in current (current density) required for the domain wall motion. According to International Publication WO2005/069368 (PTL4), for example, a current value of a write pulse is as small as about 0.35 mA (corresponding to current density=105 A/cm2).

In the typical domain wall motion type MRAM, as shown in FIGS. 1 and 2, the magnetic recording layer is provided with the constricted section or the difference in level and thereby the pinning potential for pinning the domain wall is obtained. Meanwhile, with respect to a magnetic shift register and a magnetic storage utilizing the domain wall motion, there is proposed a method of controlling a position of domain wall without forming the constricted section (for example, refer to Japanese Patent Publication JP-2008-34808 (PTL 7)).

FIG. 3 shows a structure of a magnetic storage utilizing the domain wall motion that is described in Japanese Patent Publication JP-2008-34808 (PTL 7). The magnetic storage has a magnetic wire 140 that is provided with a plurality of magnetic domains 130. The magnetic wire 140 has a domain wall 135 that moves due to a pulse current or a pulse magnetic field. The movement distance of the domain wall 135 is controlled by strength and width of the pulse magnetic field or the pulse current. Therefore, there is no need to provide a notch (constricted section) for controlling the domain wall motion.

FIG. 4 shows a relationship between the domain wall position and a pulse current application time in the case of the structure shown in FIG. 3. The relationship is calculated by a simulation. As represented by a curve CA in FIG. 4, there is a tendency that a moving speed of the domain wall becomes 0 and the domain wall stops at specific pulse current application times. According to the technique described in Japanese Patent Publication JP-2008-34808 (PTL 7), the domain wall position is controlled by setting the pulse current application time to the specific times.

CITATION LIST

Patent Literature
[PTL1] Japanese Patent Publication JP-2005-93488
[PTL2] U.S. Pat. No. 6,834,005
[PTL3] Japanese Patent Publication JP-2005-191032
[PTL4] International Publication WO2005/069368
[PTL5] Japanese Patent Publication JP-2006-73930
[PTL6] Japanese Patent Publication JP-2006-303159
[PTL7] Japanese Patent Publication JP-2008-34808

SUMMARY OF INVENTION

The inventors of the present application have recognized the following points. To form the constricted section on the magnetic recording layer as shown in FIG. 1 is getting difficult with miniaturization of element. That is, if a width of the magnetic recording layer becomes smaller with the miniaturization of element, it becomes impossible to form a minute constricted section with the current photolithography accuracy. To put it the other way around, to form the constricted section on the magnetic recording layer acts to constrict the miniaturization and high-integration of element. Moreover, in order to form the two differences in level on the magnetic recording layer as shown in FIG. 2, it is necessary to repeat exposure process at least two times. This means increase in the number of processes and thus causes increase in manufacturing costs.

It can be considered to apply the domain wall position controlling method as shown in FIGS. 3 and 4 to the domain wall motion type MRAM. That is, it can be considered to control the movement distance of the domain wall by setting the pulse current application time (pulse width) to the specific values and without forming the constricted section or the difference in level on the magnetic recording layer.

However, according to a simulation executed by the inventors of the present application, it has been found that the relationship between the domain wall position and the pulse current application time does not necessarily become as represented by the curve CA in FIG. 4 but in some cases it becomes as represented by a curve CB. In the case of the curve CB, the domain wall continues to move without stopping, although there are increase and decrease in the moving speed of the domain wall. In particular, the tendency that the domain wall continues to move without stopping has been found to be conspicuous in a case of the magnetic recording layer having the perpendicular magnetic anisotropy by which the current density required for the domain wall motion can be reduced. Therefore, it is not preferable to apply the domain wall position controlling method as shown in FIGS. 3 and 4 to the domain wall motion type MRAM that uses the magnetic recording layer having the perpendicular magnetic anisotropy. Moreover, even if the relationship as represented by the curve CA can be obtained, the fact that the movement distance of the domain wall is fixed to a predetermined value is not adequate to the MRAM for which reduction in a cell size is required.

An object of the present invention is to provide a technique that can easily achieve domain wall introduction and domain wall position control with respect to a magnetic recording layer having perpendicular magnetic anisotropy in a domain wall motion type MRAM.

In a first aspect of the present invention, a domain wall motion type MRAM is provided. The MRAM has: a magnetic recording layer being a ferromagnetic layer having perpendicular magnetic anisotropy; a pair of current supply terminals connected to the magnetic recording layer for supplying a current to the magnetic recording layer; and an anti-ferromagnetic layer being in contact with a first region of the magnetic recording layer. The first region includes a part of a current supply region of the magnetic recording layer that is between the pair of current supply terminals.

In a second aspect of the present invention, an initializing method for a domain wall motion type MRAM is provided. The MRAM has: a magnetic recording layer being a ferromagnetic layer having perpendicular magnetic anisotropy; a pair of current supply terminals connected to the magnetic recording layer for supplying a current to the magnetic recording layer; and an anti-ferromagnetic layer being in contact with a first region of the magnetic recording layer. The first region includes a part of a current supply region of the magnetic recording layer that is between the pair of current supply terminals. The initializing method includes: (A) a step of applying a first external magnetic field in a first direction perpendicular to a film surface such that a magnetization direction of the magnetic recording layer is turned to the first direction; and (B) a step of applying a second external magnetic field in a second direction opposite to the first direction such that a magnetization direction of a region of the magnetic recording layer other than the first region is turned to the second direction.

According to the present invention, it is possible to easily achieve the domain wall introduction and the domain wall position control with respect to the magnetic recording layer having the perpendicular magnetic anisotropy in the domain wall motion type MRAM. Since there is no need to provide the magnetic recording layer with the constricted section, the miniaturization and high-integration of element become possible. Moreover, since there is no need to provide the magnetic recording layer with the difference in level, the increase in the manufacturing costs can be prevented.

BRIEF DESCRIPTION OF DRAWINGS

The above and other objects, advantages and features of the present invention will be more apparent from the following description of certain exemplary embodiments taken in conjunction with the accompanying drawings.

DESCRIPTION OF EMBODIMENTS

An MRAM according to an exemplary embodiment of the present invention will be described with reference to the attached drawings. The MRAM according to the present exemplary embodiment is a domain wall motion type MRAM that uses a magnetic layer having perpendicular magnetic anisotropy. The MRAM has a plurality of magnetic memory cells that are arranged in an array form. Each of the magnetic memory cells includes a magnetoresistance element that exhibits the magnetoresistance effect.

1. Magnetic Memory Cell

Figure 5:
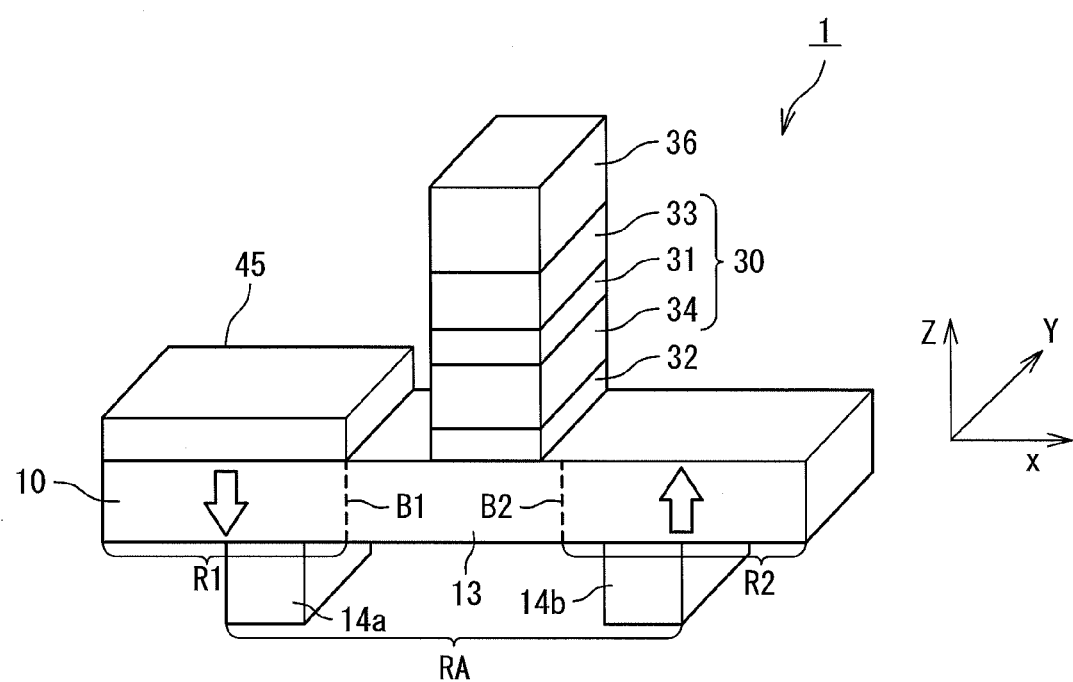
FIG. 5 is a schematic diagram showing a structure of a magnetic memory cell (magnetoresistance element) of an MRAM according to an exemplary embodiment of the present invention.

FIG. 5 shows an example of the magnetic memory cell 1 (magnetoresistance element) according to the present exemplary embodiment. The magnetic memory cell 1 has a magnetic recording layer 10 and a pinned layer 30 that are ferromagnetic layers and a tunnel barrier layer 32 that is a non-magnetic layer. The tunnel barrier layer 32 being a non-magnetic layer is a thin insulating film such as an Al2O3 film and an MgO film. The tunnel barrier layer 32 is sandwiched by the magnetic recording layer 10 and the pinned layer 30, and the magnetic recording layer 10, the tunnel barrier layer 32 and the pinned layer 30 form a magnetic tunnel junction (MTJ).

The magnetization direction of the pinned layer 30 is not changed by data write/read operations. It is therefore desirable that the magnetic anisotropy of the pinned layer 30 is greater than that of the magnetic recording layer 10. This can be achieved by varying the material and composition between the magnetic recording layer 10 and the pinned layer 30. This can also be achieved by stacking an anti-ferromagnetic layer 36 for pinning the magnetization direction of the pinned layer 30 on a surface of the pinned layer 30 on the opposite side of the tunnel barrier layer 32, as shown in FIG. 5. Moreover, the pinned layer 30 may be formed to be a laminated film of a ferromagnetic layer 33, a ferromagnetic layer 34 and a non-magnetic layer 31 sandwiched between the ferromagnetic layers 33 and 34. Here, Ru, Cu and the like can be used as material of the non-magnetic layer 31. The magnetization directions of the two ferromagnetic layers 33 and 34 are anti-parallel to each other. A leakage magnetic field from the pinned layer 30 can be suppressed by making the respective magnetizations of the two ferromagnetic layers 33 and 34 substantially equal to each other.

The magnetic recording layer 10 is a ferromagnetic layer in which a domain wall moves. The magnetic recording layer 10 according to the present exemplary embodiment is formed of a perpendicular magnetic film that has perpendicular magnetic anisotropy in a direction (Z-axis direction) perpendicular to a film surface. In the case of the magnetic recording layer 10 having the perpendicular magnetic anisotropy, a current density required for domain wall motion can be reduced, which is preferable.

The magnetic recording layer 10 preferably includes at least one material selected from Fe, Co and Ni. Moreover, if the magnetic recording layer 10 includes Pt or Pd, the perpendicular magnetic anisotropy is more stabilized, which is preferable. In addition to that, desired magnetic characteristics can be achieved by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm and the like. Concrete examples of the material of the magnetic recording layer 10 include Co, Co-Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd and Sm—Co. Besides, a layer including at least one material selected from Fe, Co and Ni and another layer may be stacked. In this case, concrete examples of the stacked film include Co/Pd, Co/Pt, Co/Ni, Fe/Au and the like. In FIG. 5, it is preferable that the pinned layer 30 also has the perpendicular magnetic anisotropy and is formed of the same material as in the case of the magnetic recording layer 10. Such materials as CoFe and CoFeB exhibiting great TMR effect may be used for a part of the magnetic recording layer 10 and the pinned layer 30, particularly for a section being in contact with the tunnel barrier layer 32.

The magnetization direction of the magnetic recording layer 10 having the perpendicular magnetic anisotropy becomes the +Z-direction or the −Z-direction perpendicular to the film surface. More specifically, the magnetic recording layer 10 includes a first region R1 whose magnetization direction is a first direction perpendicular to the film surface and a second region R2 whose magnetization direction is a second direction perpendicular to the film surface. The first direction and the second direction are opposite to each other. For example, as shown in FIG. 5, the first direction is the −Z-direction and the second direction is the +Z-direction. Moreover, the magnetic recording layer 10 includes a magnetization switching region 13 that is sandwiched between the first region R1 and the second region R2. That is, the first region R1 and the second region R2 are respectively located on both sides of the magnetization switching region 13. The magnetization direction of the magnetization switching region 13 can be switched between the +Z-direction and the −Z-direction. Therefore, in the magnetic recording layer 10, the domain wall can be formed at a first boundary B1 between the first region R1 and the magnetization switching region 13 or at a second boundary B2 between the second region R2 and the magnetization switching region 13. A method of introducing the domain wall into the magnetic recording layer 10 (i.e. initializing method) will be described later.

According to the present exemplary embodiment, the data writing is achieved by the domain wall motion method. That is, at the time of data writing, the domain wall moves within the magnetic recording layer 10 and thereby the magnetization direction of the magnetization switching region 13 is changed. As shown in FIG. 5, the magnetization switching region 13 is connected to the pinned layer 30 through the tunnel barrier layer 32, and the magnetization switching region 13, the tunnel barrier layer 32 and the pinned layer 30 form the MTJ. A resistance value of the MTJ varies depending on the magnetization direction of the magnetization switching region 13, namely whether the magnetization direction of the magnetization switching region 13 and the magnetization direction of the pinned layer 30 are "parallel" or "anti-parallel" to each other.

In order to move the domain wall in the magnetic recording layer 10, it is necessary to supply a write current in the in-plane direction in the magnetic recording layer 10. A pair of current supply terminals is provided for achieving the write current flowing in the in-plane direction. More specifically, as shown in FIG. 5, a pair of current supply terminals consisting of a first current supply terminal 14*a* and a second current supply terminal 14*b* is connected to the magnetic recording layer 10. The current supply terminals 14*a* and 14*b* may be formed on the upper side or the lower side of the magnetic recording layer 10, and can be formed through via formation process, grinding process and the like.

The pair of current supply terminals 14*a* and 14*b* is used for supplying a current to the magnetic recording layer 10. By using the pair of current supply terminals 14*a* and 14*b*, it is possible to supply the write current in a region between the current supply terminals 14*a* and 14*b*. That is, the write current can flow in the in-plane direction within the magnetic recording layer 10. The region of the magnetic recording layer 10 between the two current supply terminals 14*a* and 14*b*, namely, the region through which the write current flows is hereinafter referred to as a "current supply region RA".

The current supply region RA in which the write current flows is the region in which the domain wall can move. Therefore, at least the above-mentioned magnetization switching region 13 needs to be included in the current supply region RA. The first current supply terminal 14*a* and the second current supply terminal 14*b* are respectively provided on both sides of the magnetization switching region 13 such that the current supply region RA includes the magnetization switching region 13. As described above, the first region R1 and the second region R2 are respectively located on the both sides of the magnetization switching region 13. That is to say, the first current supply terminal 14*a* is provided on the side of the first region R1 of the magnetic recording layer 10, while the second current supply terminal 14*b* is provided on the side of the second region R2 of the magnetic recording layer 10. In other words, the first region R1 is closer to the first current supply terminal 14*a* than to the second current supply terminal 14*b*, while the second region R2 is closer to the second current supply terminal 14*b* than to the first current supply terminal 14*a*.

Moreover, the first region R1 and second region R2 whose respective magnetization directions are opposite to each other serve as spin supply sources for supplying spin electrons having opposite spins to the magnetization switching region 13 at the time of the domain wall motion. Therefore, at least a part of the first region R1 and at least a part of the second region R2 are included in the current supply region RA. In other words, the first region R1 includes a part of the current supply region RA, and preferably it is directly connected to the first current supply terminal 14*a* as shown in FIG. 5. Also, the second region R2 includes a part of the current supply region RA, and preferably it is directly connected to the second current supply terminal 14*b* as shown in FIG. 5.

The magnetic memory cell 1 according to the present exemplary embodiment further has an anti-ferromagnetic layer 45 that is so formed as to be in contact with the first region R1 of the magnetic recording layer 10. In the example shown in FIG. 5, the anti-ferromagnetic layer 45 is stacked on the first region R1 of the magnetic recording layer 10. Such materials as PtMn, NiMn, IrMn, FeMn, NiO and CoO can be used for the anti-ferromagnetic layer 45. A role of the anti-ferromagnetic layer 45 is to apply an exchange bias field to the first region R1 to fix the magnetization direction of the first region R1 in the above-mentioned first direction (e.g., the −Z-direction). In other words, a region of the magnetic recording layer 10 whose magnetization direction is fixed in the first direction due to contact with the anti-ferromagnetic layer 45 substantially corresponds to the first region R1. It should be noted that no anti-ferromagnetic layer is provided on the side of the second region R2 of the magnetic recording layer 10.

Figure 6A:
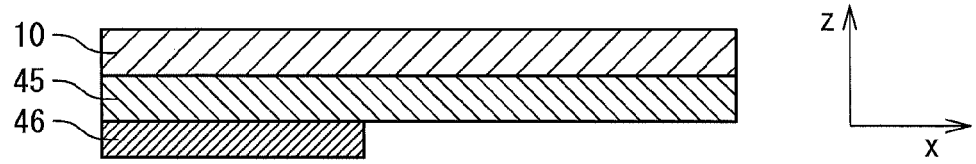
FIG. 6A is a cross-sectional view showing an example of a method of forming an anti-ferromagnetic layer according to the present exemplary embodiment.
Figure 6B:
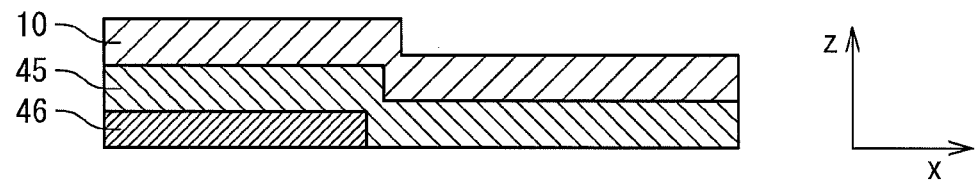
FIG. 6B is a cross-sectional view showing an example of a method of forming an anti-ferromagnetic layer according to the present exemplary embodiment.

The anti-ferromagnetic layer 45 may be formed on the lower side of the magnetic recording layer 10. Such a process can be simply considered that a material film for the anti-ferromagnetic layer 45 is first deposited, then patterning of the material film is performed, and after that a material film for the magnetic recording layer 10 is deposited. In this case, however, the deposition process for the anti-ferromagnetic layer 45 and the deposition process for the magnetic recording layer 10 are not successively performed, and there is fear that magnetic coupling between the anti-ferromagnetic layer 45 and the magnetic recording layer 10 becomes insufficient. It is therefore preferable to utilize a base layer 46 as shown in FIG. 6A or FIG. 6B. The base layer 46 is formed of such material (e.g., Ta, NiFe) that enhances magnetic characteristics of the anti-ferromagnetic layer 45 and enhances the magnetic coupling between the anti-ferromagnetic layer 45 and the magnetic recording layer 10. The base layer 46 is patterned to have a shape equivalent to that of the anti-ferromagnetic layer 45 in FIG. 5. After the base layer 46 is formed, respective material films for the anti-ferromagnetic layer 45 and the magnetic recording layer 10 are deposited successively. If a planarization process such as etching back and CMP is performed after the formation of the base layer 46, a cross-sectional shape becomes as shown in FIG. 6A. If the planarization process is omitted, a cross-sectional shape becomes as shown in FIG. 6B. In either case, a section of the anti-ferromagnetic layer 45 formed on the base layer 46 only has effective magnetic characteristics. Therefore, the anti-ferromagnetic layer 45 shown in FIG. 6A or FIG. 6B can play substantially the same role as that of the anti-ferromagnetic layer 45 shown in FIG. 5. That is, by using the base layer 46, it is possible to apply the exchange bias field only to a part (the first region R1) of the magnetic recording layer 10 while ensuring the successive deposition of the anti-ferromagnetic layer 45 and the magnetic recording layer 10.

2. Initialization of Magnetic Recording Layer

Figure 7:
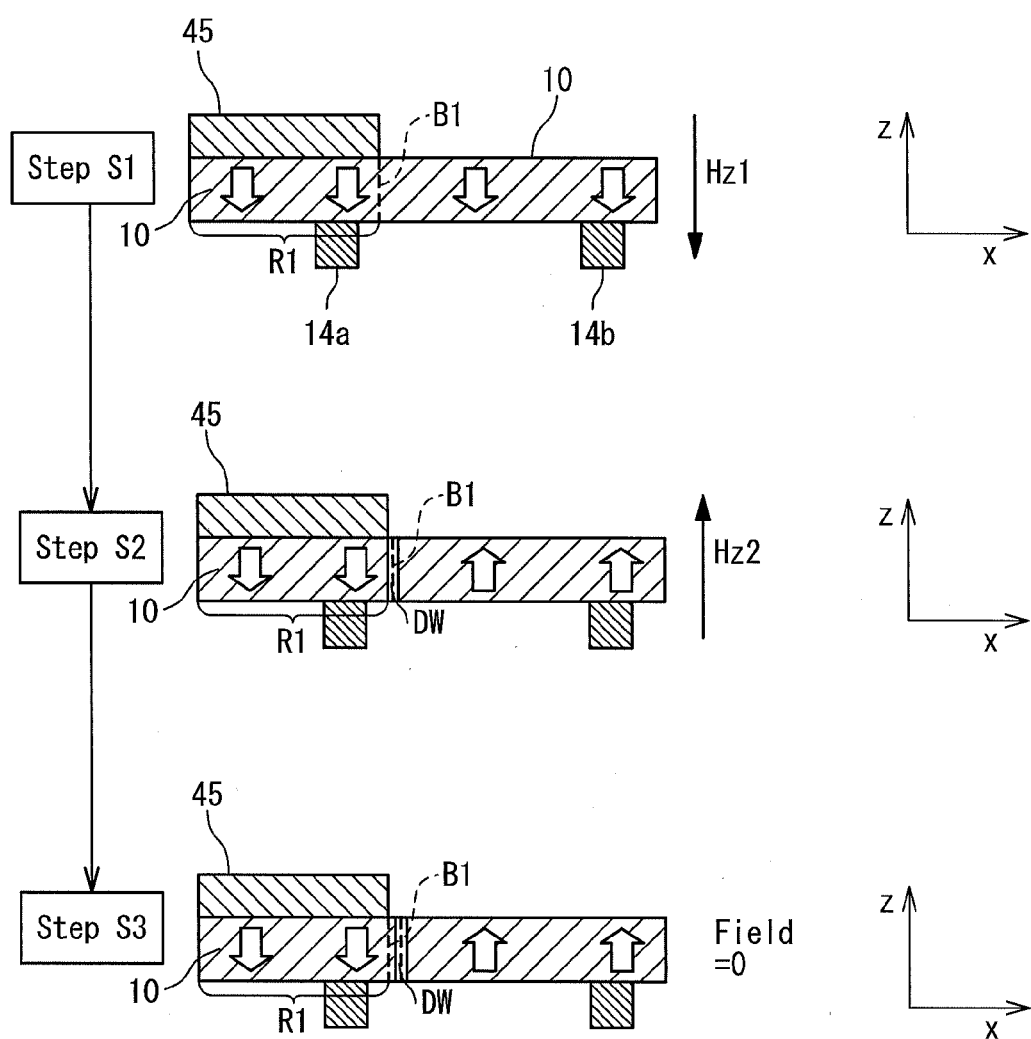
FIG. 7 is a schematic diagram showing a method of initializing a magnetic recording layer according to the present exemplary embodiment.

Next, a method for initially introducing the domain wall into the magnetic recording layer 10 according to the present exemplary embodiment will be described. Such the domain wall introducing processing is hereinafter referred to as "initialization". FIG. 7 is a schematic diagram showing a method of initializing the magnetic recording layer 10 according to the present exemplary embodiment. Here, let us consider a case where the pinned layer 30 has greater coercivity than the magnetic recording layer 10 and the magnetization direction of the pinned layer 30 does not change during the initialization process.

Step S1:

First, a first external magnetic field Hz1 in a first direction (the −Z-direction) perpendicular to the film surface is applied. As a result, the magnetization direction of whole of the magnetic recording layer 10 is turned to the first direction (the −Z-direction).

Step S2:

Next, a second external magnetic field Hz2 in a second direction (the +Z-direction) opposite to the first direction is applied. It should be noted here that magnetization reversal is less likely to occur in the first region R1 being in contact with the anti-ferromagnetic layer 45 than in the other region, due to exchange coupling with the anti-ferromagnetic layer 45. It is therefore possible by adjusting the magnitude of the second external magnetic field Hz2 to reverse the magnetization direction of only the region other than the first region R1 without reversing the magnetization direction of the first region R1. Alternatively, the magnitude of the second external magnetic field Hz2 may be gradually increased from zero. In either case, the magnetization direction of the region other than the first region R1 in the magnetic recording layer 10 is reversed and turned to the second direction (the +Z-direction). As a result, a domain wall DW is formed at the first boundary B1 between the first region R1 and the region other than the first region R1. That is to say, the domain wall DW is introduced into the magnetic recording layer 10.

Figure 2:
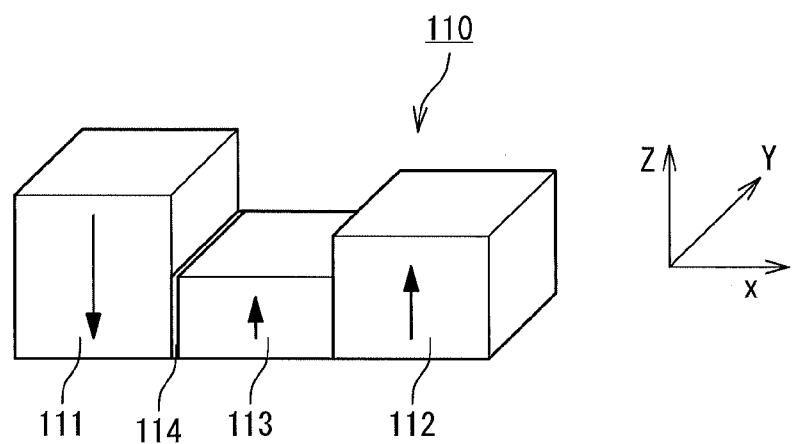
FIG. 2 is a schematic diagram showing a structure of a magnetic recording layer described in another related technique.

Step S3:

When the application of the second external magnetic field Hz2 is stopped, the domain wall DW is settled in the vicinity of the first boundary B1. The reason why the domain wall DW is not settled on the first boundary B1 at this time is that the first boundary B1 does not serve as artificial pinning potential for trapping the domain wall DW, which is different from the case of the difference in level between the ferromagnetic layers as shown in FIG. 2.

Figure 8:
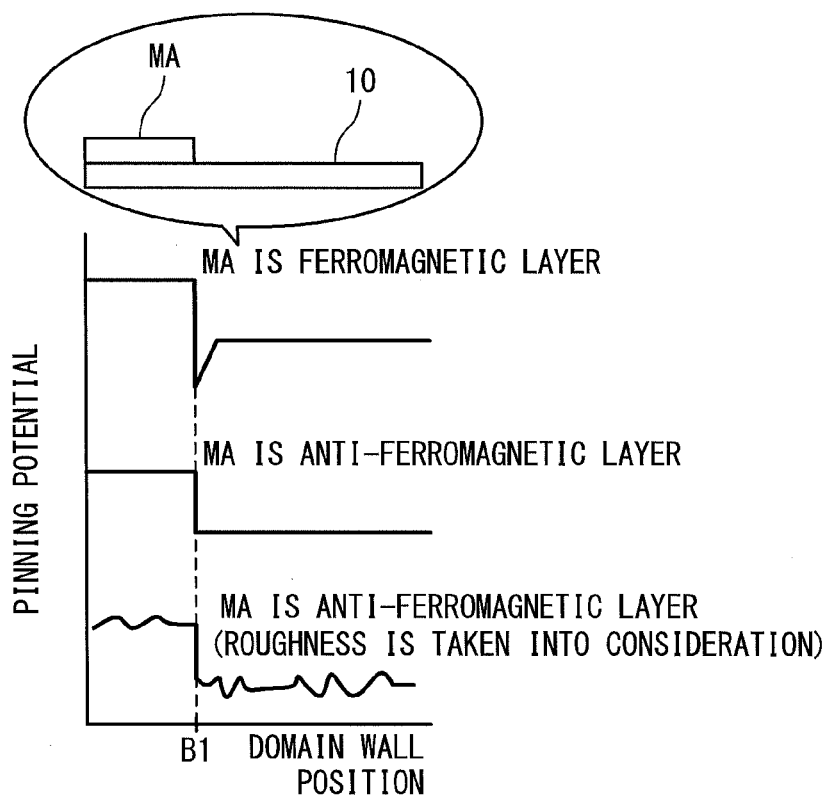
FIG. 8 is a diagram for explaining a domain wall position in the present exemplary embodiment.

FIG. 8 schematically shows the pinning potential in cases where a magnetic layer MA (ferromagnetic layer or anti-ferromagnetic layer) is stacked on the magnetic recording layer 10. A boundary of a region of the magnetic recording layer 10 on which the magnetic layer MA is stacked is the first boundary B1. In a case where the magnetic layer MA is a ferromagnetic layer, a leakage magnetic field from the ferromagnetic layer causes a position of the first boundary B1 to be a local minimum point of the pinning potential. In a case where the magnetic layer MA is an anti-ferromagnetic layer, however, there is no leakage magnetic field and thus the position of the first boundary B1 does not become a local minimum point of the pinning potential although a potential difference is generated at the first boundary B1. Therefore, an equivalent state in terms of energy is obtained when the domain wall DW is located anywhere other than the first region R1. However, in an actual magnetic recording layer 10, there exist random pinning potentials caused by edge roughness at a time of patterning, distribution of lattice defects, grain boundaries and the like. Therefore, when the application of the second external magnetic field Hz2 is stopped, the domain wall DW is settled at a local minimum point in the vicinity of the first boundary B1.

According to the present exemplary embodiment, as described above, the anti-ferromagnetic layer 45 is so provided as to be in contact with a part of the magnetic recording layer 10 and it is thus possible to easily achieve the initialization of the magnetic recording layer 10.

3. Data Writing/Reading Operations

Figure 9:
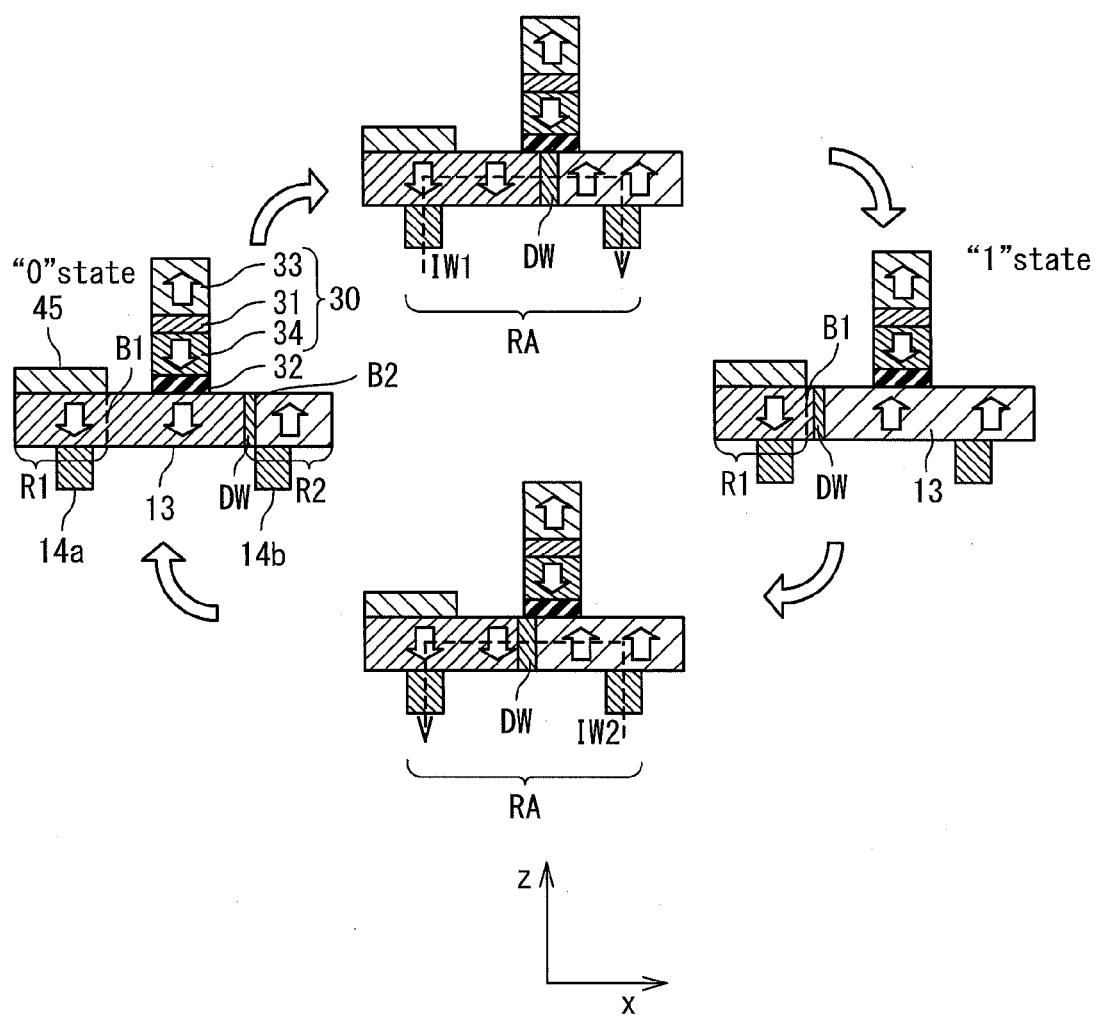
FIG. 9 is a schematic diagram showing a method of writing data to a magnetic memory cell according to the present exemplary embodiment.

Next, data writing with respect to the magnetic memory cell 1 will be described. FIG. 9 shows data writing with respect to the magnetic memory cell 1 shown in FIG. 5.

The pinned layer 30 is connected through the tunnel barrier layer 32 to the magnetization switching region 13 included in the current supply region RA of the magnetic recording layer 10. More specifically, the pinned layer 30 has a lamination structure of the ferromagnetic layer 34, the non-magnetic layer 31 and the ferromagnetic layer 33, and the ferromagnetic layer 34 among them is connected to the magnetization switching region 13 through the tunnel barrier layer 32. The resistance value of the MTJ, namely, the record data varies depending on whether the magnetization directions of the magnetization switching region 13 and the ferromagnetic layer 34 are "parallel" or "anti-parallel" to each other. For example, in FIG. 9, the parallel state is related to data "0" and the anti-parallel state is related to data "1". In the data "0" state, the magnetization direction of the magnetization switching region 13 is the −Z-direction, and the domain wall DW is located at the second boundary B2. On the other hand, in the data "1" state, the magnetization direction of the magnetization switching region 13 is the +Z-direction, and the domain wall DW is located in the vicinity of the first boundary B1.

The data writing is achieved by the domain wall motion method utilizing the spin transfer. The write current flows not in a direction penetrating through the MTJ but planarly in the magnetic recording layer 10. The write current is supplied to the magnetic recording layer 10 by using the above-mentioned current supply terminals 14a and 14b.

At a time of writing the data "1", a first write current IW1 flows from the first current supply terminal 14a through the current supply region RA to the second current supply terminal 14b. In this case, spin electrons are injected into the magnetization switching region 13 from the second region R2 having the magnetization in the +Z-direction. The spin of the injected electrons drives the domain wall DW at the second boundary B2 toward the first current supply terminal 14a. As a result, the magnetization direction of the magnetization switching region 13 is switched to the +Z-direction. Typically, the movement of the domain wall DW stops at the first boundary B1 due to the pinning potential shown in FIG. 8. Then, when the supply of the first write current IW1 is stopped, the domain wall DW is settled at a position in the vicinity of the first boundary B1.

Note that there may be a case where the domain wall DW is driven to within the first region R1, depending on the magnitude of the first write current IW1. In this case, however, exchange energy is lost. Moreover, since the first write current IW1 flows in the current supply region RA, the domain wall DW is prevented from departing from the current supply region RA. That is, there is no chance that the domain wall DW moves beyond the position of the first current supply terminal 14a. Where the domain wall DW is eventually settled after the first write current IW1 is turned OFF depends on the exchange energy, a magnitude of the random pinning potential, a magnitude, a rise time and a fall time of the write current and the like. The domain wall DW may be settled within the first region R1 or may return back to the outside of the first region R1. In either case, the write/read operation is not affected as long as the domain wall DW is settled at the random pinning potential in the vicinity of the first current supply terminal 14a.

On the other hand, at a time of writing the data "0", a second write current IW2 flows from the second current supply terminal 14b through the current supply region RA to the first current supply terminal 14a. In this case, spin electrons are injected into the magnetization switching region 13 from the first region R1 having the magnetization in the −Z-direction. The spin of the injected electrons drives the domain wall DW located in the vicinity of the first current supply terminal 14a toward the second current supply terminal 14b. As a result, the magnetization direction of the magnetization switching region 13 is switched to the −Z-direction. When the supply of the second write current IW2 is stopped, the domain wall DW is settled at a certain position within the magnetic recording layer 10. The position at which the domain wall DW is settled is the second boundary B2. Since the second write current IW2 flows in the current supply region RA, the domain wall DW is prevented from departing from the current supply region RA. That is, there is no chance that the domain wall DW moves beyond the position of the second current supply terminal 14b. In this manner, the present exemplary embodiment utilizes the fact that the write current does not flow beyond the current supply terminal and hence the movement of the domain wall is restricted.

Figure 10:
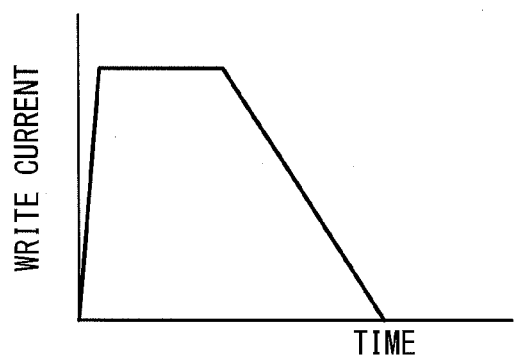
FIG. 10 is a graph showing a write current pulse at a time of writing data to the magnetic memory cell according to the present exemplary embodiment.

FIG. 10 is a graph showing a write current pulse at the time of data writing to the magnetic memory cell 1 according to the present exemplary embodiment. According to the present exemplary embodiment, the write current pulse is set such that its fall time is longer than its rise time. Such the setting is effective for settling the domain wall DW stably at a random potential in the vicinity of the current supply terminal after the write current is turned OFF. The reason is that the current-driven motion of the domain wall DW depends on time variation of the write current. That is, to make the fall time longer is effective for increasing dissipation rate of the current-driven energy to facilitate convergence of the motion of the domain wall DW.

A data read operation is as follows. At the time of data reading, a read current is so supplied as to flow between the pinned layer 30 and the magnetization switching region 13. For example, the read current flows from any of the current supply terminals 14a and 14b to the pinned layer 30 through the magnetization switching region 13 and the tunnel barrier layer 32. Alternatively, the read current flows from the pinned layer 30 to any of the current supply terminals 14a and 14b through the tunnel barrier layer 32 and the magnetization switching region 13. Based on the read current or a read potential, the resistance value of the MTJ is detected and the magnetization direction of the magnetization switching region 13 is sensed.

4. Effects

According to the present exemplary embodiment, as described above, the anti-ferromagnetic layer 45 is so provided as to be in contact with a part of the magnetic recording layer 10 in the domain wall motion type MRAM. Due to this simple structure, it is possible to easily achieve the domain wall introduction and the domain wall position control with respect to the magnetic recording layer 10.

Figure 1:
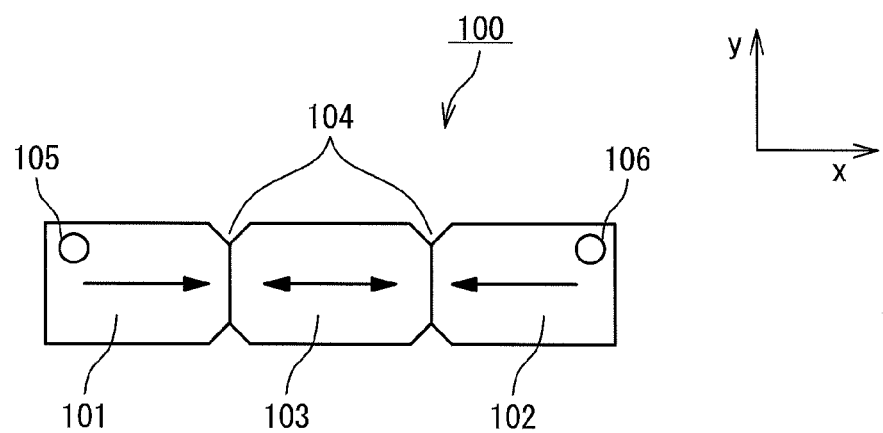
FIG. 1 is a schematic diagram showing a structure of a magnetic recording layer described in a related technique.
Figure 3:
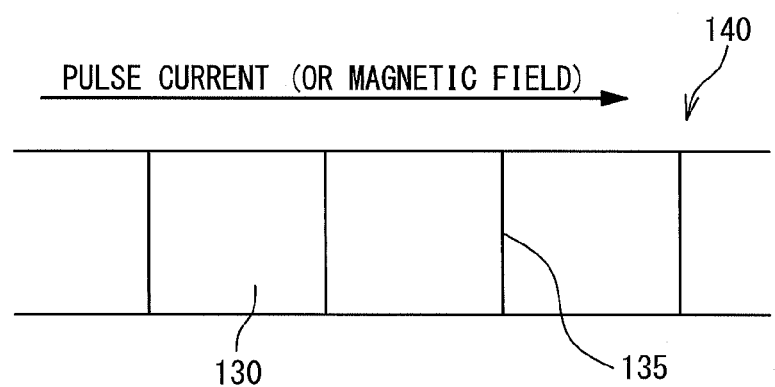
FIG. 3 is a schematic diagram showing a structure of a magnetic storage described in a still another related technique.
Figure 4:
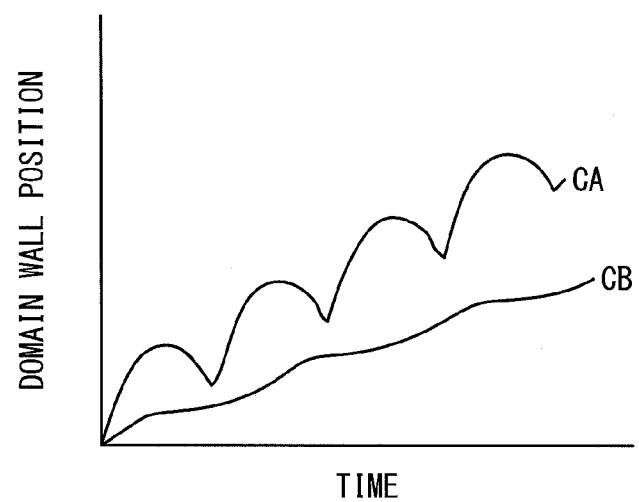
FIG. 4 is a graph showing a relationship between a domain wall position and a pulse current application time.

According to the present exemplary embodiment, there is no need to provide the magnetic recording layer 10 with the constricted section as shown in FIG. 1. As a result, the miniaturization and high-integration of element become possible. Moreover, there is no need to provide the magnetic recording layer 10 with the difference in level as shown in FIG. 2. As a result, the increase in the manufacturing costs can be prevented. Furthermore, there is no need to adopt the method of controlling the domain wall position as shown in FIGS. 3 and 4. Therefore, it is possible to well control the domain wall position in the magnetic recording layer 10 having the perpendicular magnetic anisotropy.

Moreover, in the case where the anti-ferromagnetic layer 45 is formed on the magnetic recording layer 10, there is no leakage magnetic field from the anti-ferromagnetic layer 45, as shown in FIG. 8. The leakage magnetic field may affect the domain wall motion in the magnetic recording layer 10. From a view point of write characteristics, the configuration according to the present exemplary embodiment by which the leakage magnetic field is prevented is preferable.

5. Modification Examples

The magnetic memory cell 1 according to the present exemplary embodiment can be modified variously. Various modification examples will be described below. It should be noted that the same reference numerals are given to the same components as those described above, and an overlapping description will be omitted as appropriate.

5-1. First Modification Example

Figure 11:
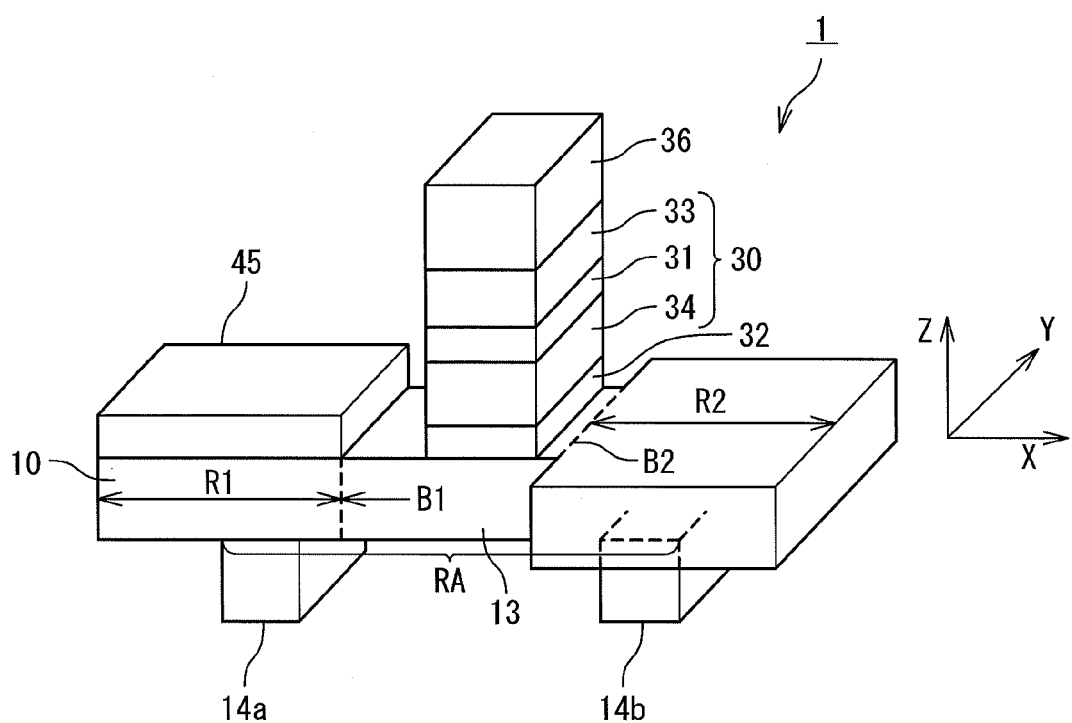
FIG. 11 is a schematic diagram showing a first modification example of the magnetic memory cell according to the present exemplary embodiment.

FIG. 11 shows a first modification example. In the first modification example, a part of the magnetic recording layer 10 is formed to be wider than the other portion. The wide portion is used as the above-mentioned second region R2. The wide second region R2 is adjacent to the magnetization switching region 13 across the second boundary B2. When the write current flows in the magnetic recording layer 10, the current density in the wide second region R2 becomes lower than the current density in the adjacent magnetization switching region 13. As a result, the domain wall DW is less likely to intrude into the second region R2. That is, the domain wall DW certainly stops at the second boundary B2 between the second region R2 and the adjacent region. Consequently, the control of the position of the domain wall DW becomes more precise.

From a view point of stopping the movement of the domain wall DW, the width of the second region R2 just needs to be large at least at the second boundary B2. In other words, the width of the second region R2 at the second boundary B2 just needs to be larger than a width of the magnetization switching region 13 at the second boundary B2. As a result, the current density of the write current decreases across the second boundary B2 from the magnetization switching region 13 towards the second region R2, and thus the domain wall movement stops at the second boundary B2. The width of the second region R2 may become smaller or larger as away from the second boundary B2 outward.

5-2. Second Modification Example

Figure 12:
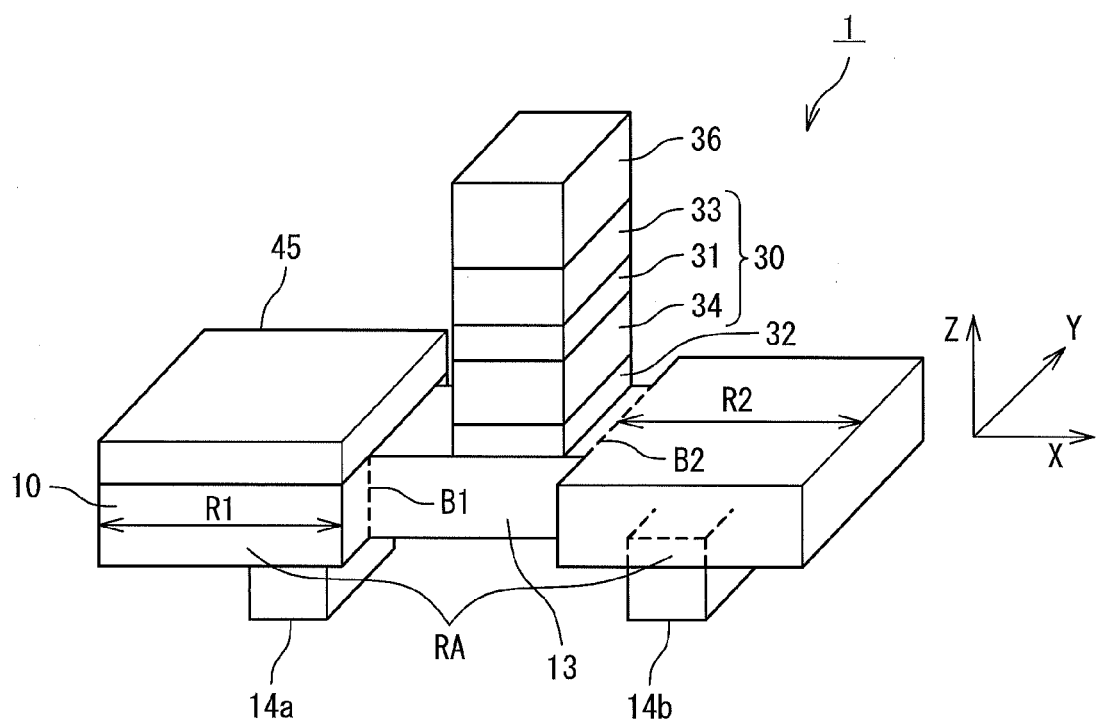
FIG. 12 is a schematic diagram showing a second modification example of the magnetic memory cell according to the present exemplary embodiment.

FIG. 12 shows a second modification example. In the second modification example, the first region R1 is formed to be wider than the magnetization switching region 13, similarly to the first modification example. That is, the first region R1 is adjacent to the magnetization switching region 13 across the first boundary B1, and the width of the first region R1 at the first boundary B1 is larger than a width of the magnetization switching region 13 at the first boundary B1. As a result, the current density of the write current decreases across the first boundary B1 from the magnetization switching region 13 towards the first region R1, and thus the domain wall movement certainly stops at the first boundary B1. The width of the first region R1 may become smaller or larger as away from the first boundary B1 outward. It is also possible that the width of the second region R2 is the same as in the case of FIG. 5 and only the first region R1 is formed to be wide.

5-3. Third Modification Example

Figure 13:
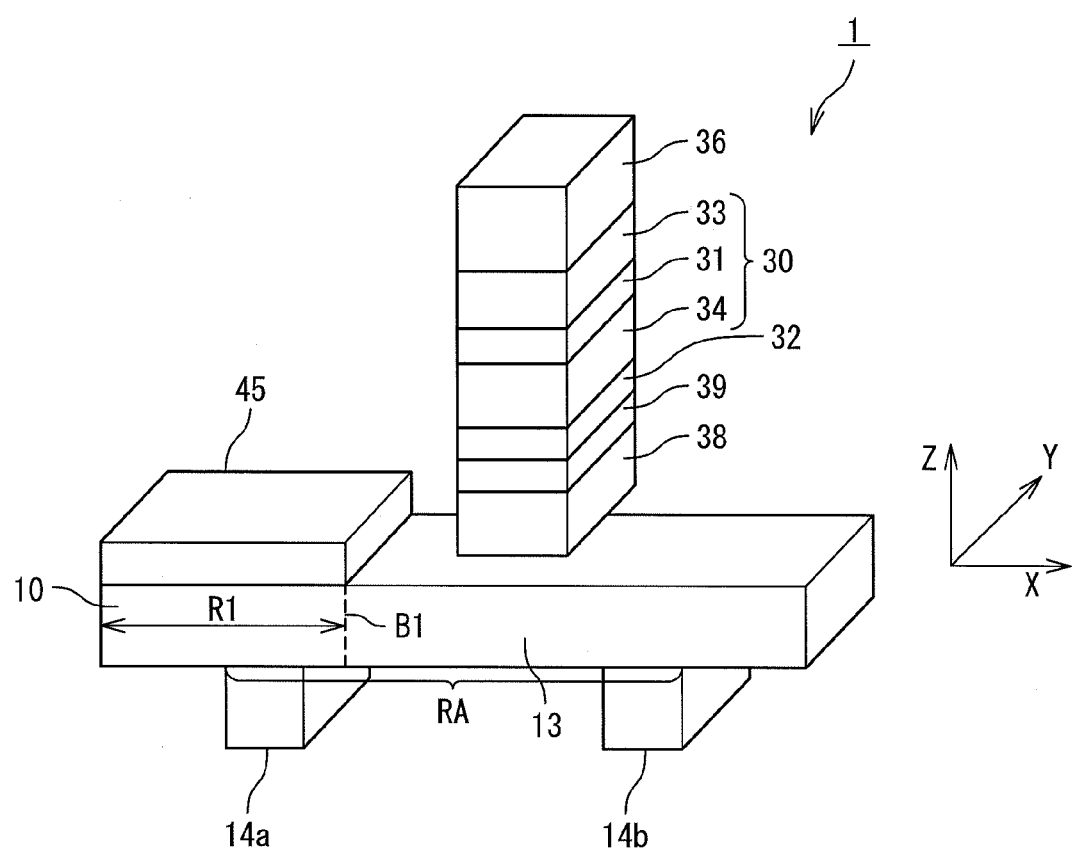
FIG. 13 is a schematic diagram showing a third modification example of the magnetic memory cell according to the present exemplary embodiment.

FIG. 13 shows a third modification example. In the third modification example, the tunnel barrier layer 32 is not in direct contact with the magnetic recording layer 10. Instead, the tunnel barrier layer 32 is in contact with a sensor layer 39 that is a ferromagnetic layer different from the magnetic recording layer 10. That is, the pinned layer 30 is connected to the sensor layer 39 through the tunnel barrier layer 32, and the pinned layer 30, the tunnel barrier layer 32 and the sensor layer 39 form an MTJ. The magnetization direction of the sensor layer 39 is reversible, and the sensor layer 39 plays a role of a magnetization free layer (free layer) of a typical MRAM. The sensor layer 39 is electrically connected to the magnetic recording layer 10 through the isolation metal layer 38.

According to the present modification example, the sensor layer 39 is magnetically coupled with the magnetization switching region 13 included in the current supply region RA of the magnetic recording layer 10. That is, the magnetization direction of the magnetization switching region 13 is reflected in the magnetization direction of the sensor layer 39. When the magnetization direction of the magnetization switching region 13 is switched, the magnetization direction of the sensor layer 39 also is switched accordingly. Therefore, to sense a magnetization state of the sensor layer 39 by using the MTJ means to sense a magnetization state of the magnetization switching region 13 of the magnetic recording layer 10. That is, according to the present modification example, the magnetization state of the magnetization switching region 13 is remotely sensed by using the sensor layer 39 that is magnetically coupled with the magnetization switching region 13.

In the present modification example, the pinned layer 30 and the sensor layer 39 may have the perpendicular magnetic anisotropy as in the case of the magnetic recording layer 10. Alternatively, the pinned layer 30 and the sensor layer 39 may have in-plane magnetic anisotropy. In the case of the in-plane magnetic anisotropy, the pinned layer 30 and the sensor layer 39 respectively have magnetizations in in-plane directions. It should be noted that, in the case of the in-plane magnetic anisotropy, it is necessary to displace a center of the sensor layer 39 from a center of the magnetization switching region 13 in order to reflect the magnetization direction of the magnetization switching region 13 in the magnetization direction of the sensor layer 39. In the example shown in FIG. 13, the sensor layer 39 and the pinned layer 30 are formed at a position displaced in the Y-direction from the magnetic recording layer 10. In other words, the sensor layer 39 and the pinned layer 30 are so formed as to partially overlap with the magnetization switching region 13 (current supply region RA).

In the present modification example, the MTJ (pinned layer 30, sensor layer 39) used for the data reading is separated from the magnetic recording layer 10 in which the write current flows. In other words, the MTJ contributing to read characteristics is separated from the magnetic recording layer 10 contributing to write characteristics. It is therefore possible to optimize the read characteristics and the write characteristics independently of each other, which is preferable.

6. Configuration of MRAM

Figure 14:
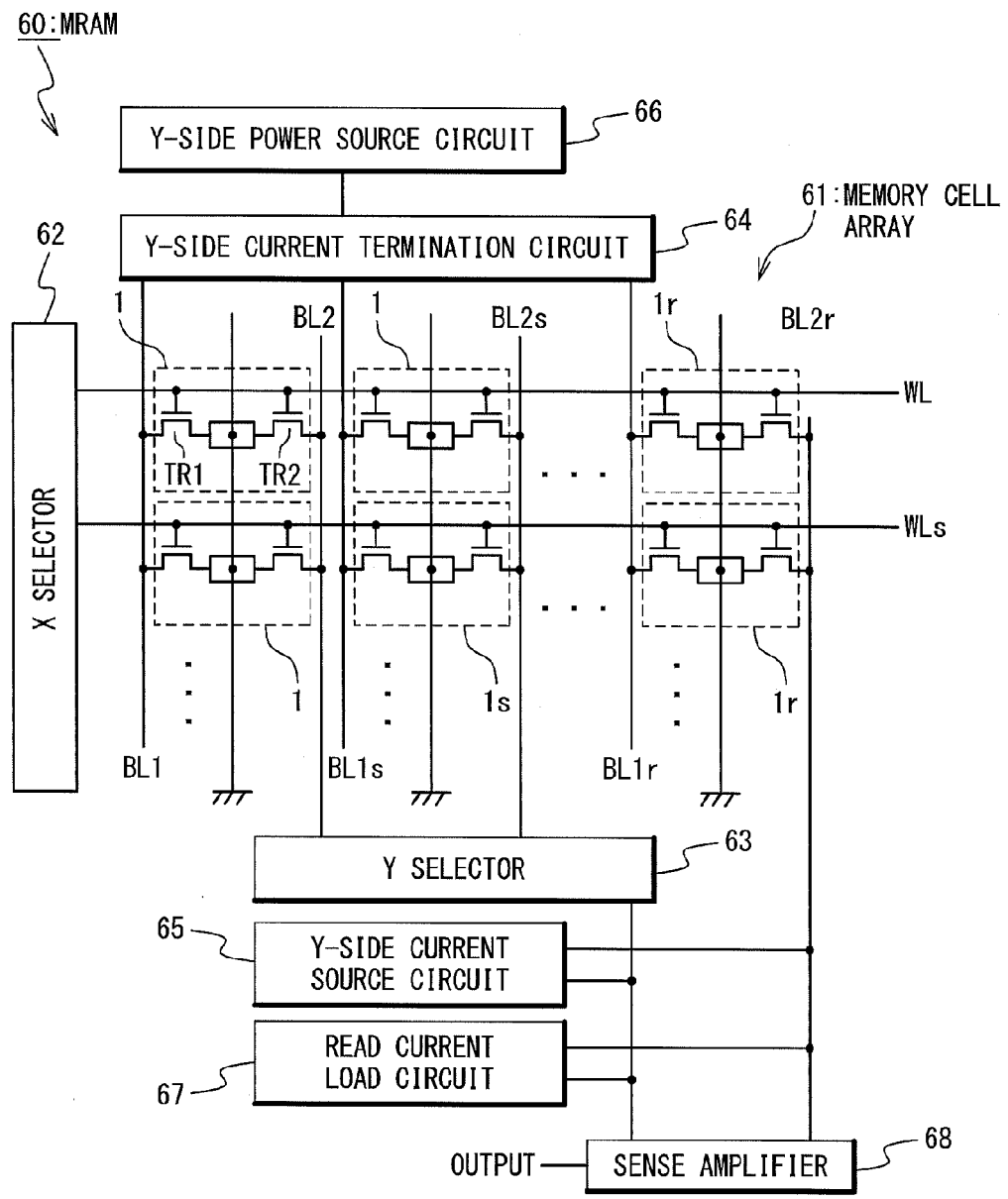
FIG. 14 is a block diagram showing a configuration of the MRAM according to the present exemplary embodiment.

FIG. 14 shows an example of a configuration of an MRAM according to the present exemplary embodiment. In FIG. 14, an MRAM 60 has a memory cell array 61 in which a plurality of magnetic memory cells 1 are arranged in a matrix form. The memory cell array 61 includes not only the magnetic memory cells 1 used for the data recording but also reference cells 1r which are referred to at the time of data reading. A structure of the reference cell 1r is the same as that of the magnetic memory cell 1.

Each magnetic memory cell 1 has select transistors TR1 and TR2 in addition to the magnetoresistance element shown in FIG. 5. One of source/drain of the select transistor TR1 is connected to the first current supply terminal 14a, and the other thereof is connected to a first bit line BL1. One of source/drain of the select transistor TR2 is connected to the second current supply terminal 14b, and the other thereof is connected to a second bit line BL2. Gates of the select transistors TR1 and TR2 are connected to a word line WL. The pinned layer 30 of the magnetoresistance element is connected to a ground line and an initialization power source through interconnections.

The word line WL is connected to an X selector 62. In the data writing and reading, the X selector 62 selects a word line WL connected to a target memory cell 1s as a selected word line WLs. The first bit line BL1 is connected to a Y-side current termination circuit 64, and the second bit line BL2 is connected to a Y selector 63. The Y selector 63 selects a second bit line BL2 connected to the target memory cell 1s as a selected second bit line BL2s. The Y-side current termination circuit 64 selects a first bit line BL1 connected to the target memory cell 1s as a selected first bit line BL1s.

A Y-side current source circuit 65 supplies or draws a predetermined write current (IW1, IW2) with respect to the selected second bit line BL2s at the time of data writing. A Y-side power source circuit 66 supplies a predetermined voltage to the Y-side current termination circuit 64 at the time of data writing. As a result, the write current (IW1, IW2) flows into the Y selector 63 or flows out from the Y selector 63. The above-mentioned X selector 62, Y selector 63, Y-side current termination circuit 64, Y-side current source circuit 65 and Y-side power source circuit 66 constitute a "write current supply circuit" for supplying the write currents IW1 and IW2 to the magnetic memory cells 1.

At the time of data reading, the first bit line BL1 is set to "Open". A read current load circuit 67 supplies a predetermined read current to the selected second bit line BL2s. Also, the read current load circuit 67 supplies the predetermined current to a reference second bit line BL2r which is connected to the reference cell 1r. A sense amplifier 68 senses data of the target memory cell 1s based on a difference between a potential of the reference second bit line BL2r and a potential of the selected second bit line BL2s, and outputs the data.

The exemplary embodiments of the present invention have been described above with reference to the attached drawings. However, the present invention is not limited to the above-described exemplary embodiments and can be appropriately modified by a person skilled in the art without departing from the scope of the invention.

This application is based upon and claims the benefit of priority from Japanese patent application No. 2008-183703, filed on Jul. 15, 2008, the disclosure of which is incorporated herein in its entirely by reference.

The invention claimed is:

1. A magnetic random access memory of domain wall motion comprising:
    a magnetic recording layer being a ferromagnetic layer having perpendicular magnetic anisotropy;
    a pair of current supply terminals connected to said magnetic recording layer for supplying a current to said magnetic recording layer; and
    an anti-ferromagnetic layer being in contact with a first region of said magnetic recording layer,
    wherein said first region includes a part of a current supply region of said magnetic recording layer that is between said pair of current supply terminals,
    wherein said pair of current supply terminals includes a first current supply terminal and a second current supply terminal,
    wherein said first current supply terminal is connected to said first region,
    wherein said magnetic recording layer includes a second region whose magnetization direction is opposite to a magnetization direction of said first region,
    wherein said second current supply terminal is connected to said second region,
    wherein the anti-ferromagnetic layer is not provided on the second region.

2. The magnetic random access memory according to claim 1,
    wherein said first region is adjacent to another region of said magnetic recording layer across a first boundary, and
    a width of said first region at said first boundary is larger than a width of said another region at said first boundary.

3. The magnetic random access memory according to claim 1,
    wherein said second region is adjacent to another region of said magnetic recording layer across a second boundary, and
    a width of said second region at said second boundary is larger than a width of said another region at said second boundary.

4. The magnetic random access memory according to claim 1, further comprising a pinned layer being a ferromagnetic layer whose magnetization direction does not vary,
    wherein said pinned layer is connected to said current supply region of said magnetic recording layer through a nonmagnetic layer.

5. The magnetic random access memory according to claim 1, further comprising:
    a pinned layer being a ferromagnetic layer whose magnetization direction does not vary; and
    a sensor layer being a ferromagnetic layer that is connected to said pinned layer through a non-magnetic layer,
    wherein said sensor layer is magnetically coupled with said current supply region of said magnetic recording layer.

6. The magnetic random access memory according to claim 5,
    wherein said sensor layer and said pinned layer have in-plane magnetic anisotropy and partially overlap with said current supply region.

7. An initializing method for a magnetic random access memory of domain wall motion,
    wherein said magnetic random access memory comprises:
    a magnetic recording layer being a ferromagnetic layer having perpendicular magnetic anisotropy;
    a pair of current supply terminals connected to said magnetic recording layer for supplying a current to said magnetic recording layer; and
    an anti-ferromagnetic layer being in contact with a first region of said magnetic recording layer,
    wherein said first region includes a part of a current supply region of said magnetic recording layer that is between said pair of current supply terminals,
    wherein said pair of current supply terminals includes a first current supply terminal and a second current supply terminal,
    wherein said first current supply terminal is connected to said first region,
    wherein said magnetic recording layer includes a second region whose magnetization direction is opposite to a magnetization direction of said first region,
    wherein said second current supply terminal is connected to said second region,
    wherein the anti-ferromagnetic layer is not provided on the second region,
    wherein said initializing method comprises:
    applying a first external magnetic field in a first direction perpendicular to a film surface such that a magnetization direction of said magnetic recording layer is turned to said first direction; and
    applying a second external magnetic field in a second direction opposite to said first direction such that a magnetization direction of a region of said magnetic recording layer other than said first region is turned to said second direction.

8. A writing method for a magnetic random access memory of domain wall motion,
    wherein said magnetic random access memory comprises:
    a magnetic recording layer being a ferromagnetic layer having perpendicular magnetic anisotropy;
    a pair of current supply terminals for supplying a current to said magnetic recording layer; and
    an anti-ferromagnetic layer being in contact with a first region that includes a part of a current supply region of said magnetic recording layer that is between said pair of current supply terminals,
    wherein said writing method is characterized in that a fall time of a write current pulse is longer than a rise time thereof.

* * * * *

UNITED STATES PATENT AND TRADEMARK OFFICE
CERTIFICATE OF CORRECTION

PATENT NO.       : 8,625,327 B2                                                      Page 1 of 1
APPLICATION NO.  : 13/054577
DATED            : January 7, 2014
INVENTOR(S)      : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 242 days.

Signed and Sealed this
Twenty-second Day of September, 2015

Michelle K. Lee
*Director of the United States Patent and Trademark Office*